US006643913B2

(12) United States Patent
Uchikoba et al.

(10) Patent No.: US 6,643,913 B2
(45) Date of Patent: Nov. 11, 2003

(54) METHOD OF MANUFACTURING A LAMINATED FERRITE CHIP INDUCTOR

(75) Inventors: Fumio Uchikoba, Chuo-ku (JP); Toshiyuki Anbo, Chuo-ku (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/852,794

(22) Filed: May 11, 2001

(65) Prior Publication Data

US 2001/0030592 A1 Oct. 18, 2001

Related U.S. Application Data

(62) Division of application No. 09/460,420, filed on Dec. 14, 1999, now Pat. No. 6,249,206.

(30) Foreign Application Priority Data

Dec. 15, 1998 (JP) .......................................... 10-356813

(51) Int. Cl.[7] ............................. H01F 7/06; H05K 3/12

(52) U.S. Cl. .......................... 29/602.1; 29/604; 29/609; 29/846; 419/6; 419/8

(58) Field of Search ............................... 29/602.1, 604, 29/830, 831, 846, 851, 25.41, 25.42, 609; 419/6, 8; 336/190, 200, 223, 232, 225

(56) References Cited

U.S. PATENT DOCUMENTS 4,543,553 A * 9/1985 Mandai et al. ............ 29/602.1
4,689,594 A * 8/1987 Kawabata et al. .......... 336/200
4,880,599 A * 11/1989 Charles et al. ................ 419/6
5,312,503 A * 5/1994 Yuki ......................... 29/602.1
5,821,846 A * 10/1998 Leigh et al. ................ 336/200
5,945,902 A * 8/1999 Lipkes et al. ............. 29/602.1
5,970,604 A * 10/1999 Person et al. .......... 29/602.1 X

FOREIGN PATENT DOCUMENTS

| | | | | |
|---|---|---|---|---|
| JP | 59-113608 | * | 6/1984 | ................ 29/602.1 |
| JP | 4-65807 | * | 3/1992 | ................. 336/200 |
| JP | 5-326270 | * | 12/1993 | |
| JP | 5-326271 | * | 12/1993 | |
| JP | 5-326272 | * | 12/1993 | |
| JP | 6-69617 | * | 3/1994 | .................. 29/830 |
| JP | 6-338414 | * | 12/1994 | |
| JP | 7-22243 | * | 1/1995 | |
| JP | 7-245242 | * | 9/1995 | |
| JP | 8-250333 | * | 9/1996 | |
| JP | 8-264320 | * | 10/1996 | |

* cited by examiner

*Primary Examiner*—A. Dexter Tugbang
(74) *Attorney, Agent, or Firm*—Oblon, Spivak, McClelland, Maier & Neustadt, P.C.

(57) ABSTRACT

A method of manufacturing a laminated ferrite chip inductor array, including the steps of printing on individual ferrite sheets having electrically communicating through holes U-shaped conductor patterns disposed 180° to one another, piling the ferrite sheets together, and sintering the piled ferrite sheets to form the inductor array.

2 Claims, 3 Drawing Sheets

METHOD OF MANUFACTURING A LAMINATED FERRITE CHIP INDUCTOR

This application is a Division of application Ser. No. 09/460,420 Filed on Dec. 14, 1999 now U.S. Pat. No. 6,249,206.

BACKGROUND OF THE INVENTION

The invention relates to a new laminated ferrite chip inductor array which is structurally improved by controlling migration phenomena of silver (Ag) conductors inevitably occurring in an ultra small array holding therein a plurality of adjacent ferrite chip inductors so as to avoid troubles such as bad conditions like an electric short.

Parts of face-mounted type, for example, a ferrite inductor array have already been known where multiple layers of ferrite sheets printed with U-shaped internal conductor patterns 1 and 2 are piled such that the U-shaped patterns on adjacent ferrite sheets are opposed as faced one another, and channels which are composed by sintering the piled layers of coil shaped structure of the internal conductive printed patterns 1 and 2 made electrically communicating via through holes 3, pierced in the ferrite sheets are, as shown in FIG. 2, arranged in parallel within the interior of a ferrite 4.

In electronic equipment, tendency of miniaturization has recently been intensive and accompanying therewith parts to be used thereto have also been much demanded to be miniaturized. For example, in chip condensers or chip resistors, the specification of a 1005 shape (length: 1 mm, width: 0.5 mm and height: 0.5 mm) is going to be general, and demands for array mounting a plurality of such elements are increasing.

However, in the chip inductor, complicated figures as the coil shaped internal conductive structure as mentioned above must be formed inside of the ferrite porcelain, and so the miniaturization accompanies various difficulties, and the response to demands has considerably been delayed, comparing with the technical fields of condensers or resistors. Nowadays, inductors of a 1608 shape (length: 1.6 mm, width: 0.8 mm and height: 0.8 mm) and arrays of four circuits built-therein of 3216 shape (length: 3.2 mm, width: 1.6 mm and height: 1.6 mm) have been put in practiced at last.

There have been proposals up to now, with respect to the ferrite chip inductor array, that the arrangement of the internal inductors are devised to provide higher inductance with more miniaturized chip sizes (JP-A-5-326270, JP-A-5-326271 and JP-A-5-326272). Other several proposals are for improving interaction between circuits, i.e., crosstalk (JP-A-6-338414, JP-A-7-22243, JP-A-8-250333 and JP-A-8-264320).

However, in case of arrays holding therein four circuits of 2010 shape (length: 2.0 mm, width: 1.0 mm and height: 1.0 mm) or less, there occurs a peculiar problem called as a migration phenomenon of the internal conductors which cannot be solved by the conventional art. The migration phenomenon sometimes occurs in multiple layers of ceramics, and when a DC electric field is impressed between the internal conductors, the conductive metal migrates in response to its electric field strength or depending upon a hot and humid environment, and finally it results in an electric short badness. This phenomenon is remarkable in the case where silver is used as the internal conductor. In the inductor of a single circuit, since electric potential is almost the same in any portions of the conductor, the migration phenomenon does not occur and there is no special problem.

On the other hand, in a case of the array, it is required that no short occurs even when the electric potential difference occurs between circuits, and therefore the migration occurs as an important problem. In regard to the migration phenomenon, in case the chip size is 3216 shape or more as before, it is possible to secure an enough space between electrodes, so that the electric field strength is weak, and the conductive metal does not reach a distance generating the short, but in case of chips of 2010 shape or less, since distances between the adjacent conductors is around 100 μm, the short badness inevitably occurs.

FIGS. 3A and 3B are explanatory views showing the arrangement of the channels within the laminated ferrite chip inductor array of the prior four circuits type. FIG. 3A is an top view, and FIG. 3B is a cross sectional view along A—A line of FIG. 3A. As is seen, the respective channels 5 are disposed by alternately facing the U-shaped internal conductive patterns 1 and the adjacent U-shaped internal conductive patterns 2, and these internal conductive patterns are electrically communicated via the through holes 3, and are held in the ferrite.

The array in this Example is composed with four circuits of such channels, and the internal conductive patterns 1 in the channels are arranged in parallel within the same plan face corresponding to one another, while the internal conductive patterns 2 respectively facing them are arranged in parallel within the same plan face corresponding to one another. Each of the channels 5 disposed in the same direction.

As shown in FIGS. 3A and 3B, the conventionally existing arrangement makes the same disposal of the internal conductive patterns in the respective channels, and the chip of 3216 sized type does not cause the short badness due to the migration of the metal conductor, but a miniaturization smaller than 2010 sized type causes frequently the short badness by the migration.

SUMMARY OF THE INVENTION

The invention has been realized to provide a structural improvement where even in case of the minute laminated ferrite chip inductor arrays of 2010 shape or less, any short badness does not occur by the migrations of the internal conductive materials.

Inventors of this patent application made earnest studies on avoidance of the electric short badness accompanied with the miniaturization of the ferrite chip inductor arrays, consequently devised relative positions which are disposed with the respective ferrite chip inductors to be held in the arrays, and found it possible to accomplish the object of the structural improvement by separating distances between respective channels as much as possible, and based on this finding they accomplished the invention.

That is to say, the invention is to offer the laminated ferrite chip inductor array, in which the array is composed in that multiple layers of ferrite sheets printed with U-shaped patterns of internal conductors are piled in such a manner that the U-shaped patterns of the internal conductors on adjacent sheets are opposed as faced one another, and a plurality of channels composed by sintering the piled layers of coil-shaped structure of the internal conductive printed patterns made electrically communicating via through holes pierced in the ferrite sheets are held in ferrite porcelains, characterized in that the internal conductive pattern shapes of the adjacent chip inductors are turned 180 degree one another.

DETAILED DESCRIPTION OF THE PREFERRED EMBODIMENTS

The invention will be explained with reference to the attached drawings.

Figure 1A:
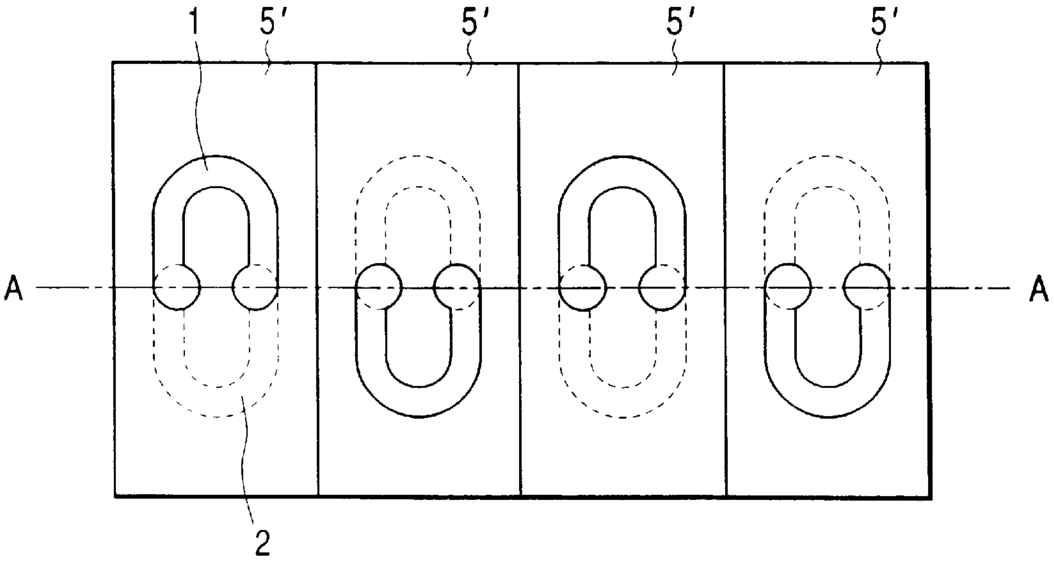
FIGS. 1A and 1B are a top view and a cross sectional view showing the channel arrangement within the array of the invention.
Figure 1B:
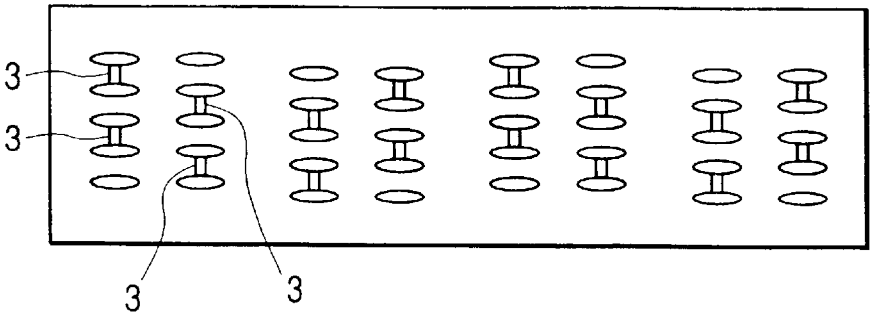

FIGS. 1A and 1B are explanatory views showing the arrangement of channels within the laminated ferrite chip inductor array of four-circuit type of the invention. FIG. 1A is a top view, and FIG. 1B is a cross sectional view along A—A line of FIG. 1A.

As is seen, the array of the invention has the same structure as the conventional one, but the arrangement of the respective channels 5' within the array is different. Namely, in the array of the invention, the adjacent channels are alternately turned 180 degree one another.

When the ferrite and the internal conductive metal are baked concurrently, stress is generated in the ferrite porcelain due to difference in coefficient of the thermal expansion of both, and in an ultra case, separation occurs at the boundary between the porcelain and the metal. In general, when the stress is impressed to the ferrite, permeability tends to decrease, and this phenomenon is particularly remarkable when the ferrite sheet and the silver conductor are baked concurrently, and there has been a proposal that positively separates the porcelain and the metal at the boundary so as to suppress the phenomenon (JP-A-4-65807), but in spite of such a manner, it is difficult to avoid the separation exerting at the boundary between the ferrite porcelain and the internal conductive pattern.

In order to prevent the stress in the ferrite porcelain, the internal conductive printed patterns may be interposed between the ferrite sheets with air gap.

With respect to the migrations bringing about the short between circuits, two types are assumed that one type passes the ferrite layer, and the other type occurs in the surface of the ferrite layer, and as the short badness is occasioned under a condition of high humidity, it is reasonable to consider that steam accelerates the migration on the boundary of the ferrite porcelain.

For controlling the migration at the interface of the ferrite porcelain layer, it is desirable to take the distance between the channels as long as possible on the same interface, whereby an electric field strength to be a motive force of the migration is lowered, and in case the migration occurs, it is possible to take long the distance until the short.

Figure 3A:
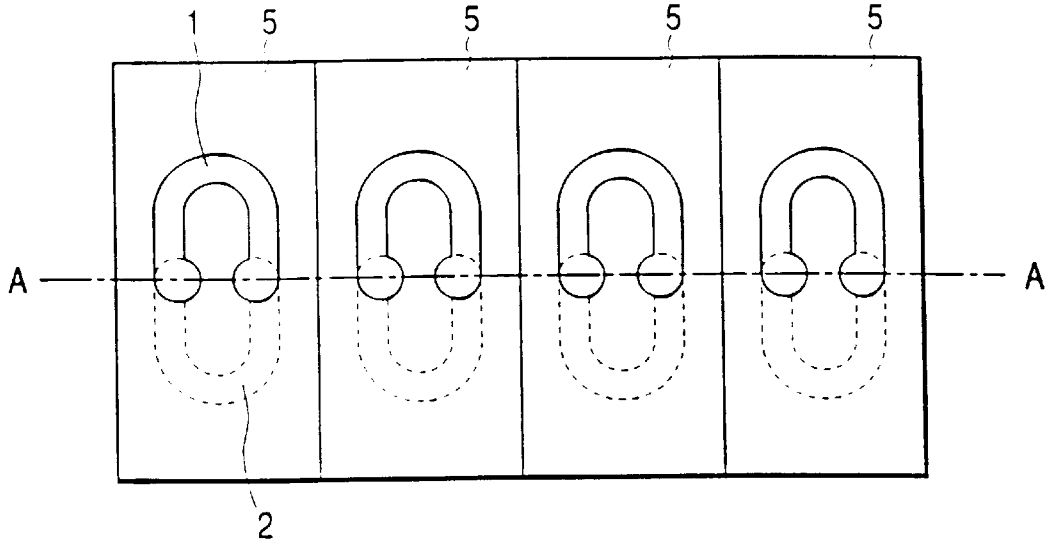
FIG. 3A PRIOR ART
FIGS. 3A and 3B are a top view and a cross sectional view showing the channel arrangement within the array of the prior art array.
Figure 3B:
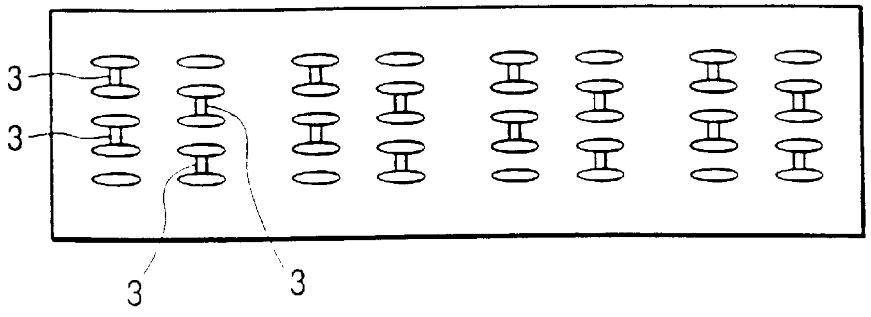
FIG. 3B PRIOR ART

To the short badness by the migration, it is effective to separate the respective channel conductors on the same ferrite layer one another, and since the channel arrangement of FIG. 1 can take more the distance between the adjacent coils than the conventional channel arrangement of FIG. 3, the short badness by the migration can be effectively avoided.

EXAMPLES

The invention will be explained in more detail referring to Examples.

The chips of 100 pieces were laid under the circumstance at the temperature of 85° C. and the humidity of 85%, voltage of 20V was impressed between the channels, the insulation resistance between the respective channels were measured after 500 hours, and the occurrence number of the migration was shown with the number of chips of 10 kΩ or less.

Reference Example

Ferrous oxide powders 49.5 mol %, nickelous oxide powders 14.5 mol %, cupreous oxide powders 15 mol % and zinc oxide powders 21 mol % were mixed with a pure water in a ball mill, dried, and heated 720° C. for 4 hours to turn out ferrites of a spinel structure, and the ferrite was pulverized to be powders of specific surface area being around 7 $cm^2/g$.

The ferrite powders 100 weight parts were added with 100 weight parts of a mixture (1:1:1) of ethyl alcohol, toluene and xylene as well as 5 weight parts of butyral resin as a binder so as to prepare a slurry, and was coated on a film of polyethylene terephtalate by the Dr. Blade's method and dried to produce a green sheet.

Figure 2:
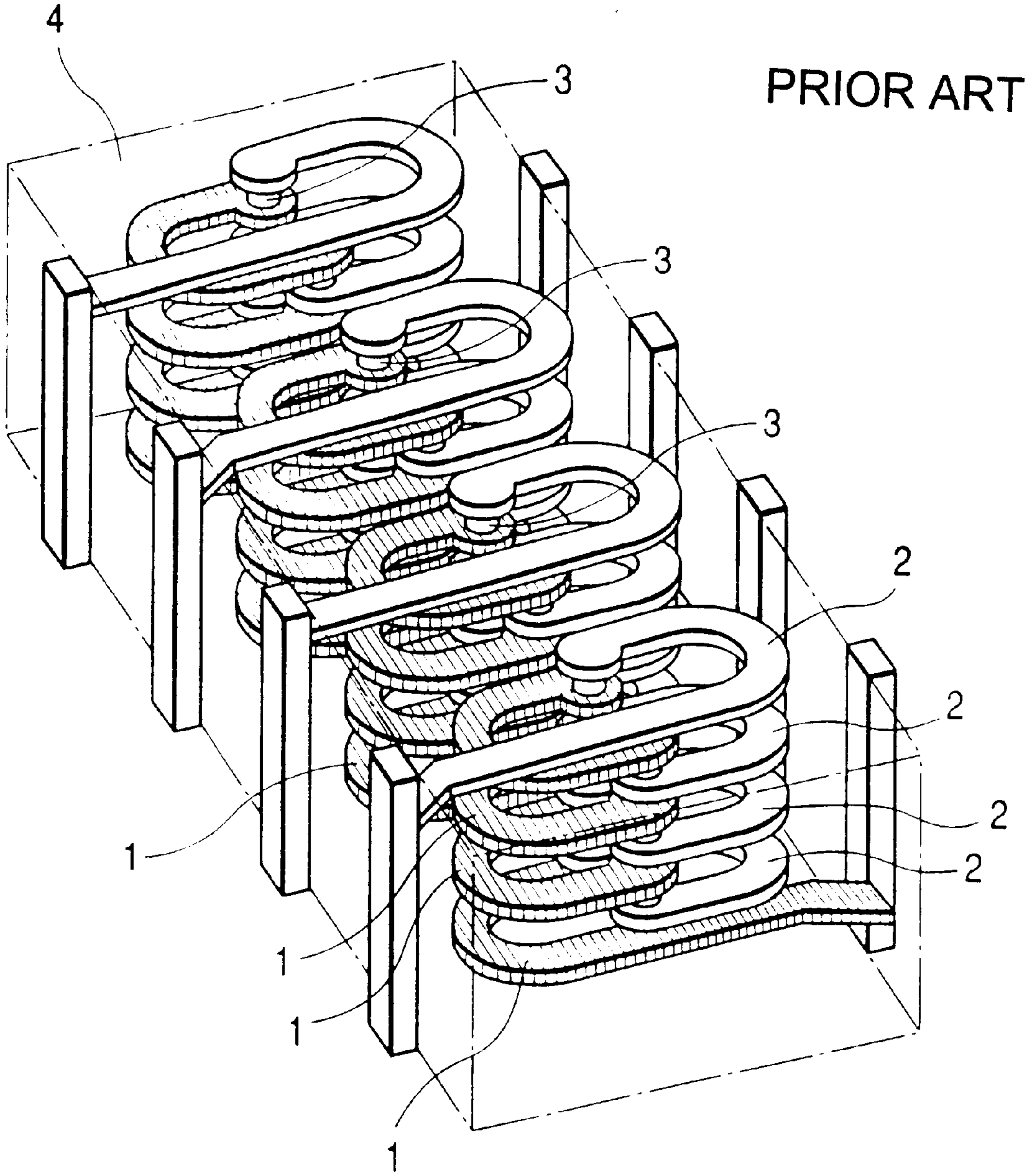
FIG. 2 is a perspective view of the prior art array.

The green sheet was pierced with through holes of 80 μm diameter by a laser beam machining and formed with silver conductive patterns of around 10 μm thickness with a paste thereof to be fill up in the through holes concurrently. The ferrite green sheets printed with the thus provided silver conductive patterns were piled as shown in FIG. 3, pressed with pressure of 800 kg/cm2 at a temperature of 50° C. followed by cutting into desired shapes, subjected to a de-bindering, baked 900° C. for 2 hours, and subsequently formed with terminal electrodes, whereby the laminated ferrite chip inductor array of the four (4) circuits typed 3216 size and 2010 size as illustrated in FIG. 2 was produced.

Their sizes and the number of normal samples (no migration occurred) per 100 samples are shown in Table 1.

TABLE 1

| Sizes & Forms | 2010 | 3216 |
|---|---|---|
| Horizontal size of array (mm) | 2.0 | 3.2 |
| Vertical size of array (mm) | 0.9 | 1.5 |
| Distance between channels (mm) | 0.09 | 0.15 |
| Distance between patterns of Ag conductor (μm) | 15 | 15 |
| Thickness of Ag conductor pattern (μm) | 8 | 8 |
| Number of normal samples (no migration) (Chip/100 chips) | 36 | 100 |

As is seen from this Table, no occurrence of the migration was recognized in the 3216 sized chips, while the migrations occurred in many of the 2010 sized chips.

Examples 1 to 10 and Comparative Examples 1 to 4

Using the same materials as those of the Reference Examples, produced was the laminated ferrite chip inductor array of the four-circuit type of the channel arrangements (B) shown in FIG. 1 and the channel arrangements (A) shown in FIG. 3.

These occurrence number of the migration is shown in Table 2.

TABLE 2

| Examples | | Arrangement of channels | Distance between patterns of conductors (μm) | Thickness of conductor pattern (μm) | Generating number of migrations (Chip/100 chips) | Remarks |
|---|---|---|---|---|---|---|
| I | 1 | B | 15 | 8 | 0 | |
| | 2 | B | 3 | 8 | 52 | Increase of Rdc (Direct current resistance) |
| | 3 | B | 5 | 8 | 0 | |
| | 4 | B | 10 | 8 | 0 | |
| | 5 | B | 20 | 8 | 0 | |
| | 6 | B | 25 | 8 | 0 | |
| | 7 | B | 15 | 3 | 0 | |
| | 8 | B | 15 | 5 | 0 | |
| | 9 | B | 15 | 10 | 0 | |
| | 10 | B | 15 | 15 | 15 | |
| II | 1 | A | 15 | 8 | 64 | |
| | 2 | A | 25 | 8 | 17 | |
| | 3 | A | 15 | 3 | 56 | Deviation of laminated layers |
| | 4 | A | 15 | 15 | 79 | Deviation of laminated layers |

Note: I: Examples, II: Comparative Examples

As is seem from this Table, in the chips of the 2010 size, inferior goods are remarkably decreased and high quality is available by making the channel arrangement (B) than by making the channel arrangement (A), and especially excellent results are obtained in the case of the distance between the conductive patterns being 5 to 20 μm and the thickness thereof being 5 to 10 μm.

If the distance is 5 μm or less, the channel arrangement (B) shows good results to a certain extent in comparison with the channel arrangement (A) but not noticeable. If it exceeds 20 μm, good results to a certain extent may be secured depending upon even the channel arrangement (A).

In accordance with the invention, merely by changing the arrangement of the channels within the array, it is possible to suppress the short badness resulted in the migration phenomenon in the laminated ferrite chip inductor array of the minute size, and to obtain products of high quality.

What is claimed is:

1. A method of manufacturing a laminated ferrite chip inductor array, comprising steps of:

printing, on individual ferrite sheets having electrically communicating through holes, U-shaped conductor patterns disposed 180° to one another on each ferrite sheet;

piling the ferrite sheets together; and sintering the piled ferrite sheets to form the laminated ferrite chip inductor array with each U-shaped conductor pattern opposed adjacent to one another on each of said individual ferrite sheets.

2. The method of claim 1, wherein the step of piling comprises the step of:

interposing an air gap between at least one part of the U-shaped conductors and the ferrite sheets.

* * * * *

UNITED STATES PATENT AND TRADEMARK OFFICE

CERTIFICATE OF CORRECTION

PATENT NO. : 6,643,913 B2
DATED : November 11, 2003
INVENTOR(S) : Uchikoba et al.

It is certified that error appears in the above-identified patent and that said Letters Patent is hereby corrected as shown below:

Title page, Item [54] and Column 1, lines 1 and 2,
Title should read:
-- A METHOD OF MANUFACTURING A LAMINATED FERRITE CHIP INDUCTOR ARRAY --

Title page,
Item [75], Inventors, should read:
-- [75] Inventors: Fumio Uchikoba, Tokyo, (JP);
Toshiyuki Anbo, Tokyo (JP) --

Signed and Sealed this

Second Day of March, 2004

JON W. DUDAS
*Acting Director of the United States Patent and Trademark Office*